United States Patent
Csaszar

(10) Patent No.: US 10,068,815 B2
(45) Date of Patent: Sep. 4, 2018

(54) TEST STRUCTURE FOR TESTING VIA RESISTANCE AND METHOD

(71) Applicant: GLOBALFOUNDRIES INC., Grand Cayman (KY)

(72) Inventor: Farkas M. Csaszar, Radebeul Saxony (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/388,136

(22) Filed: Dec. 22, 2016

(65) Prior Publication Data

US 2018/0182677 A1   Jun. 28, 2018

(51) Int. Cl.
| | |
|---|---|
| H01L 21/66 | (2006.01) |
| H01L 23/522 | (2006.01) |
| H01L 23/528 | (2006.01) |
| H01L 21/768 | (2006.01) |
| G01R 27/08 | (2006.01) |

(52) U.S. Cl.
CPC .............. *H01L 22/34* (2013.01); *G01R 27/08* (2013.01); *H01L 21/76816* (2013.01); *H01L 21/76877* (2013.01); *H01L 22/20* (2013.01); *H01L 22/30* (2013.01); *H01L 23/528* (2013.01); *H01L 23/5226* (2013.01)

(58) Field of Classification Search
None
See application file for complete search history.

(56) References Cited

U.S. PATENT DOCUMENTS

| | | | |
|---|---|---|---|
| 6,362,638 B1 | 3/2002 | Ashton et al. | |
| 7,053,634 B2 | 5/2006 | Okajima | |
| 8,551,877 B2 | 10/2013 | Ranjan et al. | |
| 2006/0220012 A1* | 10/2006 | Wu | H01L 22/34 |
| | | | 257/48 |

OTHER PUBLICATIONS

Stavitski et al. ("Stavitski" N. Stavitski "Cross-Bridge Kelvin Resistor Structures for Reliable Measurement of Low Contact Resistances and Contact Interface Characterization" IEEE Trans. on Semi. Man. vol. 22, Iss. 1 Feb. 3, 2009 pp. 551 to 554).*
Bhushan et al. ("Bhushan" M. Bhushan "Microelectronic Test Structures for CMOS Technology: Chapter 2 Test Structure Basics" copyright 2011 pp. 11-65).*

* cited by examiner

*Primary Examiner* — Asok K Sarkar
*Assistant Examiner* — Grant Withers
(74) *Attorney, Agent, or Firm* — Anthony Canale; Hoffman Warnick LLC

(57) ABSTRACT

Aspects of the present disclosure include a semiconductor test device and method. The test device includes a first Kelvin testable structure and a second Kelvin testable structure. The first Kelvin testable structure includes an upper metal plate, a plurality of dummy vias and one measurement via under and electrically connected to the upper plate and a lower metal island electrically connected to the one measurement via. The second Kelvin testable structure includes an upper reference metal plate, a reference via under and electrically connected to the upper reference metal plate, and a lower metal reference island electrically connected to the reference via.

15 Claims, 5 Drawing Sheets

TEST STRUCTURE FOR TESTING VIA RESISTANCE AND METHOD

FIELD OF THE INVENTION

The present application relates to a test structure and method for determining if manufacturing processes for production of semiconductor wafers need to be modified.

BACKGROUND

Traditional optical via critical dimension (CD) measurements can be used in the manufacturing production line and measure the via diameter at the bottom (vb) and top (vt) of the via. If there is a large difference between top and bottom via CD value, then "chamfering" is occurring. It can also be detected when chamfering occurs using mid-via CD measurements, however, even with mid-via CD measurements it cannot be determined, how deep (vd) the chamfer is going inside the via, therefore how much process margin is there left. If at the measurement site the distance between via bottom and chamfer bottom are so small that at other parts the wafer chamfer reach all the way down to the metal below due to normal on-wafer local process variation, then the process margin can be considered insufficient.

Traditional cross sectional cuts (X-SEM, X-TEM) are able to provide a cross-sectional view of processed material, measuring all the dimensions (vt), (vb), (vd). However, this is a destructive method and cannot be applied in a production line to monitor functional semiconductor wafers.

It would be desirable to have a method of monitoring whether a significant amount of chamfering, with a large depth is occurring during manufacture of semiconductor wafers.

BRIEF SUMMARY

A first embodiment of the present disclosure provides a semiconductor test device including a first Kelvin testable structure and a second Kelvin testable structure. The first Kelvin testable structure includes an upper metal plate, one measurement via under and electrically connected to the upper plate and a lower metal island electrically connected to the one measurement via. The second Kelvin testable structure includes an upper reference metal plate, a reference via under and electrically connected to the upper reference metal plate, and a lower metal reference island electrically connected to the reference via.

A second embodiment of the present disclosure provides a method of determining a differential resistance in a semiconductor device. The method includes providing a first Kelvin testable structure including an upper metal plate a plurality of dummy vias and one measurement via electrically connected to and under the upper plate. The first testable Kelvin structure includes a lower metal island electrically connected to the one measurement via. The method includes providing a second Kelvin testable structure including an upper reference metal plate a reference via electrically connected to and under the upper metal reference plate. The second Kelvin testable structure includes, a lower metal reference island electrically connected to the reference via. The resistance of the measurement via is determined by applying a first current to either the lower metal island or the upper metal plate and determining the voltage drop between the upper metal plate and the lower metal island. The resistance of the reference via is determined by applying a second current to either the lower metal reference island or upper metal reference plate and determining the voltage drop between the upper metal reference plate and the lower metal reference island. The resistance of the measurement via and the resistance of the reference via are compared to determine the differential resistance.

A third embodiment of the present disclosure provides a method of determining a differential resistance in a semiconductor device. The method includes providing a first Kelvin testable structure including an upper metal plate, a plurality of dummy vias and one measurement via under and electrically connected to the upper plate. The first Kelvin testable structure includes a lower metal island electrically connected to the one measurement via. The method includes providing a second Kelvin testable structure including an upper metal reference plate, a reference via electrically connected to the upper metal reference plate and a lower metal reference island under and electrically connected to the reference via. The upper metal reference plate and the upper metal plate are electrically connected. The differential resistance of the measurement via and the references via is determined by simultaneously applying a current to the lower metal island of the first Kelvin testable structure and to the lower metal reference island of the second Kelvin testable structure. The differential voltage between the upper metal plate and the upper metal reference plate is determined and the differential resistance is determined.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The disclosure will now be described by reference to the accompanying figures. In the figures, various aspects of the structures have been shown and schematically represented in a simplified manner to more clearly describe and illustrate the disclosure. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the disclosure is not limited to constructions of any particular shape.

In dual damascene processes (especially via-first trench-last vias), when multiple vias are placed in dense array under an upper metal plate, an effect called "chamfering" occurs, which means that on the top of the via there is a wider section than at the bottom of the via. This effect occurs less frequently in wafer regions where only single vias, or low via-count arrays are present, hence via chamfering is strongly density dependent.

Figure 1:
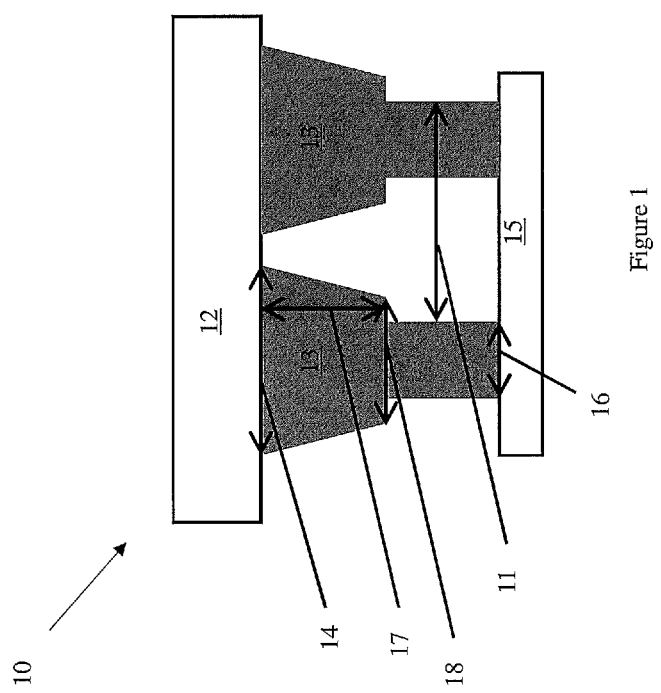
FIG. 1 illustrates chamfering in an area of high density of vias in a semiconductor.

FIG. 1 shows chamfering occur in a high density region on a region of a wafer 10. The region of the wafer 10 has an upper metal plate 12 and a lower metal island 15 and vias 13 that are closely packed. The vias 13 show a critical dimension (top CD) 14 (vt) being the width of the via where it contact the upper metal plate 12. The vias 13 show a critical dimension (bottom CD) 16 (vb) being the width of the via where it contacts the lower metal island 15. Top CD 14 (vt) is wider than bottom CD 16 (vb). FIG. 1 show the CD of the chamfer 18. The chamfer CD 18 varies depending on the density of the vias in the region of wafer 10. In extreme cases, the chamfer depth 17 (vd) can be so big, that the chamfer reaches all the way down to the bottom, and this causes a drastic increase in bottom CD width 16 (vb) of the via, which leads to failures in the functionality of the wafer 10, often due to too wide vias not enclosed within the metal section below and therefore causing defects affecting the structures below and aside. Pitch 11 is the distance between equal points of adjacent vias in an array. Critical density of the vias for chamfering is when the pitch 11 is less than or equal to 5 times the via bottom CD 16 for an array of at least three by three vias.

To minimize the effects of chamfering, the manufacturing process needs to be tuned so that either the chamfer depth 17 (vd) is minimal, or completely eliminated. In order to apply such a stable process, it is important to monitor the chamfering in-line in production in order to prevent wafer scrap and excursions.

Another potential application for the test structure disclosed herein is to monitor via density related etch or lithography process differences on via bottom CD 16 or via top CD 14. In this application, the critically dense vias impacted by the CD deviation can be directly compared to the less dense vias through their electrical resistance and therefore parametric to their final functionality in the circuit, rather than indirectly through optical or mechanical CD measurements.

Disclosed herein is a method and test structure for early detection of critical "chamfering" in the production. Furthermore, the disclosure herein allows detection at the stage when the chamfer depth 17 still has not reached the via bottom 16 (vb), thereby providing a metric of sufficient process margin for process control.

A Kelvin testable structure can be used to test variations in a printed semiconductor wafer. Kelvin testable structures printed at various locations across a semiconductor wafer may be used to test the resistance response of a via. In a Kelvin testable structure current is supplied via a pair of source connections (current leads). The current leads generate a voltage drop across the impedance to be measured according to Ohm's law V=IR. A pair of sense connections (voltage leads) are provided close to the target impedance, so that they do not include the voltage drop in the current leads but are used to determine the voltage drop across the device being measured.

The semiconductor test device disclosed herein includes a first Kelvin testable structure and a second Kelvin testable structure. The first Kelvin testable structure includes an upper metal plate. Under the upper metal plate, vias are arranged in a critically dense configuration. The vias include dummies vias and one measurement via. Dummy vias are vias that are not being measured. Under the measurement via there is a lower metal island. The resistance at the measurement via is measured in a four-point Kelvin arrangement. The second Kelvin testable structure includes a metal reference plate similar to the first metal plate. The second Kelvin testable structure has one reference via which corresponds to the measurement via in the first Kelvin testable structure. Under the reference via there is a lower metal reference island similar to the lower metal island of the first Kelvin testable structure. The metal reference plate and lower metal reference island are similar to the upper metal plate and the lower metal island in that the metal configuration around the landing or connection of the reference via in the second Kelvin testable structure needs to be identical to the landing or connection of the measurement via with the upper metal plate and lower metal island. Identical means that from the center of the via, metals are identical within the range of two times the via bottom CD 16 horizontally. This ensures that the field lines related to the measurement of the via are distributed the same way as the field line to the reference via. The resistance of the reference via is measured in a four-point Kelvin arrangement. The reference via resistance measurement is compared to the measurement via resistance to whether determine unacceptable chamfering has occurred on the measurement via. If unacceptable chamfering has occurred on the measurement via, the processes for manufacturing the wafer are adjusted. If unacceptable chamfering occurs, then, for example, the processed wafer can be scrapped, and the trench etch time can be reduced on the etch tool for subsequent wafers.

Figure 2:
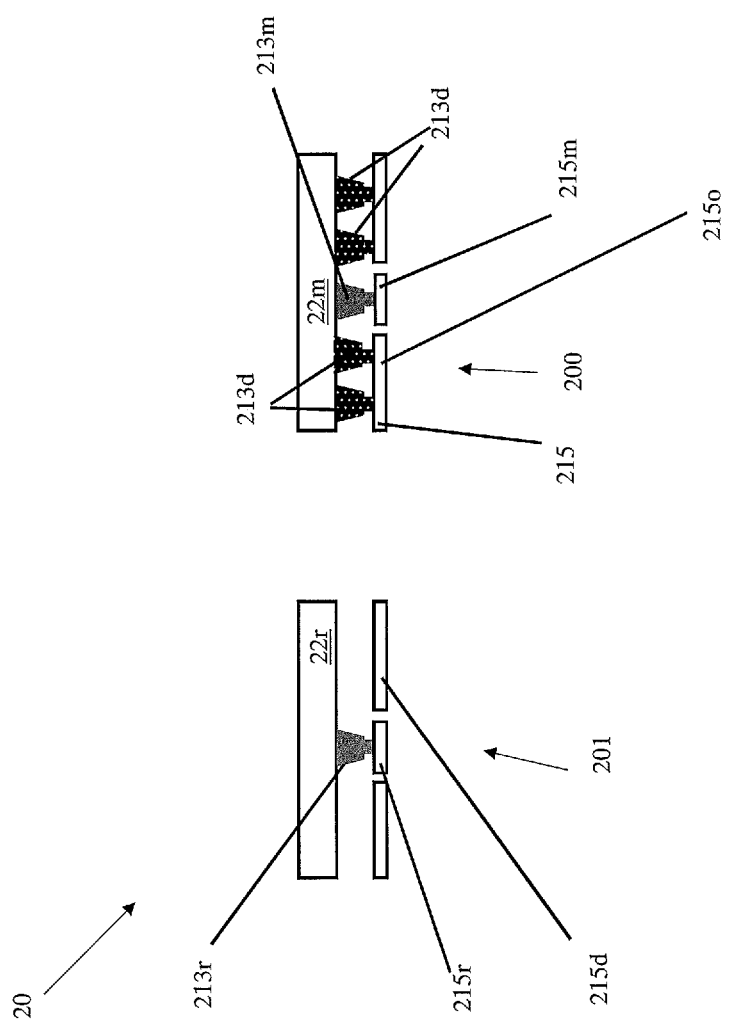
FIG. 2 illustrates a sectional view of an embodiment of a test structure disclosed herein.
Figure 3:
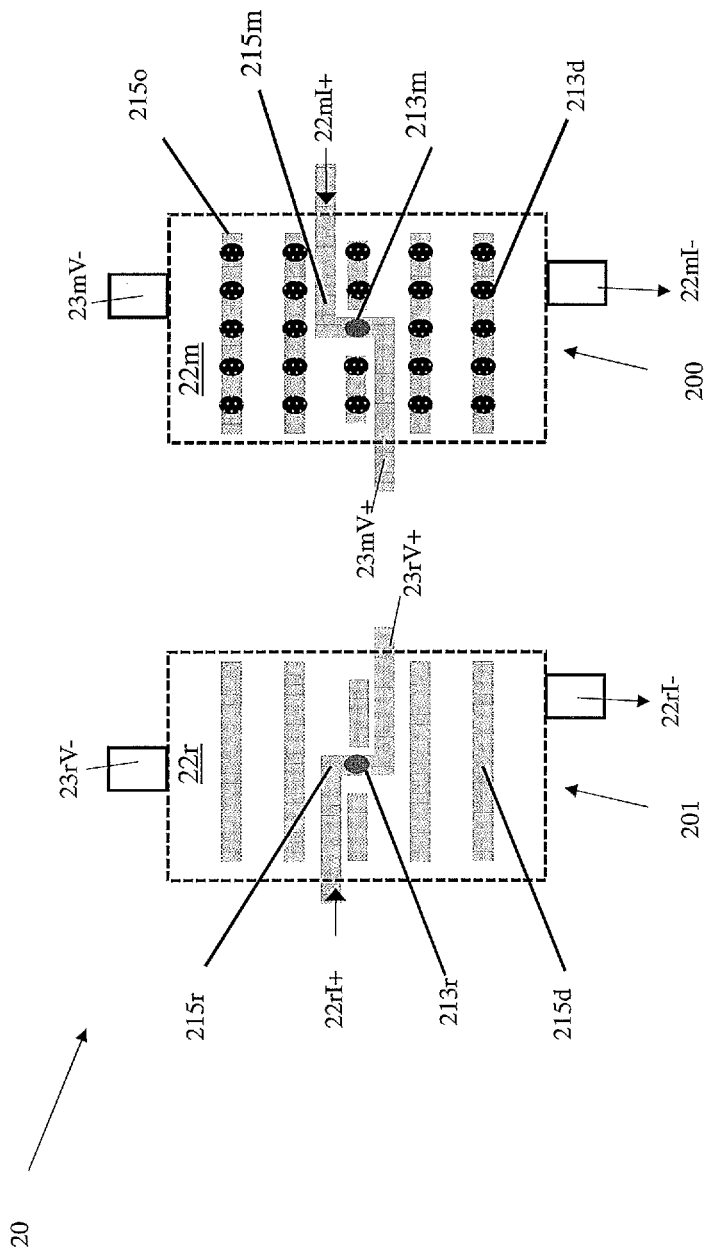
FIG. 3 illustrates a top view of an embodiment of a test structure disclosed herein.

FIGS. 2 and 3 illustrate an embodiment of a semiconductor test device 20 disclosed herein. FIG. 2 is a side view of and FIG. 3 is an overhead view. The semiconductor test device 20 includes a first Kelvin testable structure 200 and a second Kelvin testable structure 201. The first Kelvin testable structure 200 includes an upper metal plate 22$m$ electrically connected to a plurality of vias 213$m$ and 213$d$ that are packed at a high density according to the wafer specification. Dummy vias 213$d$ are optionally electrically connected to lower metal islands 215$o$. Via 213$m$ is electrically connected to lower metal island 215$m$. Lower metal island 215$m$ and 215$o$ are electrically connected indirectly through other elements, but do not directly touch each other. Via 213$m$ is measured using Kelvin testing. The second Kelvin testable structure 201 includes an upper metal plate 22$r$ electrically connected to a via 213$r$. Via 213$r$ is electrically connected to lower metal reference island 215$r$. Lower metal reference island 215$r$ is similar to lower metal reference island 215$m$. Via 213$r$ is in the same position on second Kelvin testable structure 201 as via 213$m$ is on first Kelvin testable structure 200. Via 213$r$ is measured using 4 point Kelvin testing.

In FIG. 3, the test structure 20 shows upper metal plates 22$m$ and 22$r$ in dashed outline for Kelvin test structures 200 and 201 respectively. Via resistance is measured using two analog Kelvin testable structures and enables the comparison of a critical configuration to a normal configuration. Comparison can be done by measuring two structures independently in the embodiment described. In embodiments, the measurement of test structure 200 is accomplished be applying a current 22$m$I+ through the lower metal island 215$m$. The voltage differential between the upper metal plate 22$m$ and the lower metal island 215$m$ is measured using probes or connections at 23$m$V+ and 23$m$V−. From the voltage measurements, the resistance of 213$m$ can be calculated from by the formula: resistance=[(23$m$V+)−(23$m$V−)]/22$m$I+. The drain of the current is shown at 22mI−. However, in embodiments, the current could be applied through the upper metal plate and the drain through the lower metal island. The measurement of structure 201 is similar to that of test structure 200. A current 22rI+ is applied to lower metal reference island 215r. The voltage difference of the second Kelvin testable structure is measured between 23rV+ and 23rV−. The resistance of via 213r can then be determined by the formula: resistance [(23rV+)−(23rV−)]/22rI+. The current could be applied through the upper metal reference plate 22r and the drain could be on the lower metal reference island 215r.

Figure 4:
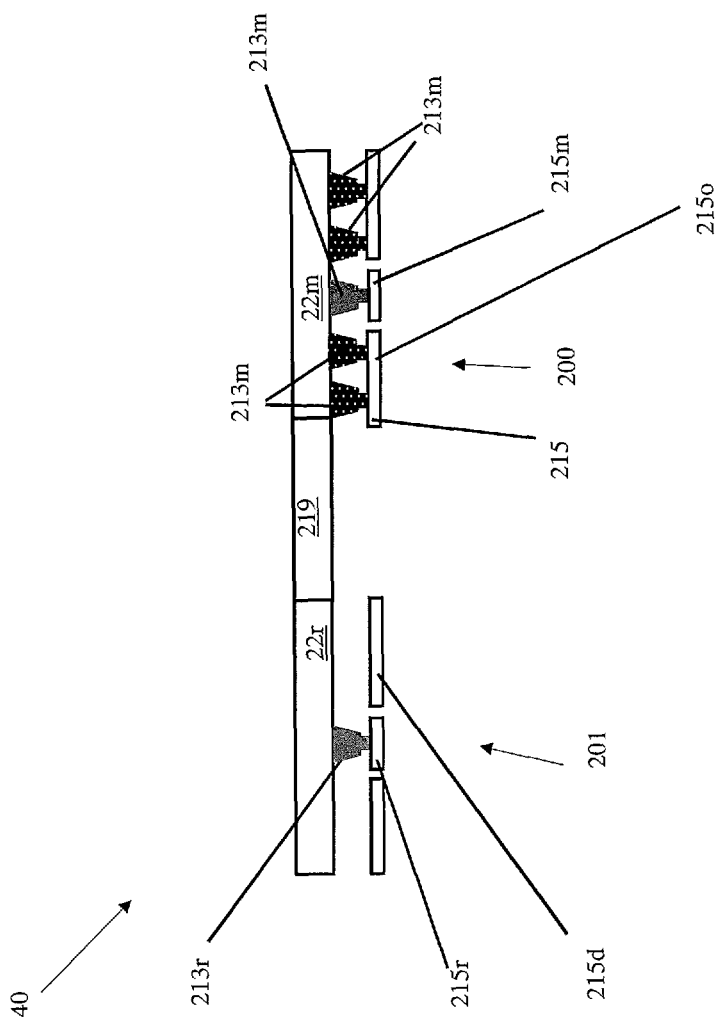
FIG. 4 illustrates a sectional view of an embodiment of a test structure disclosed herein.
Figure 5:
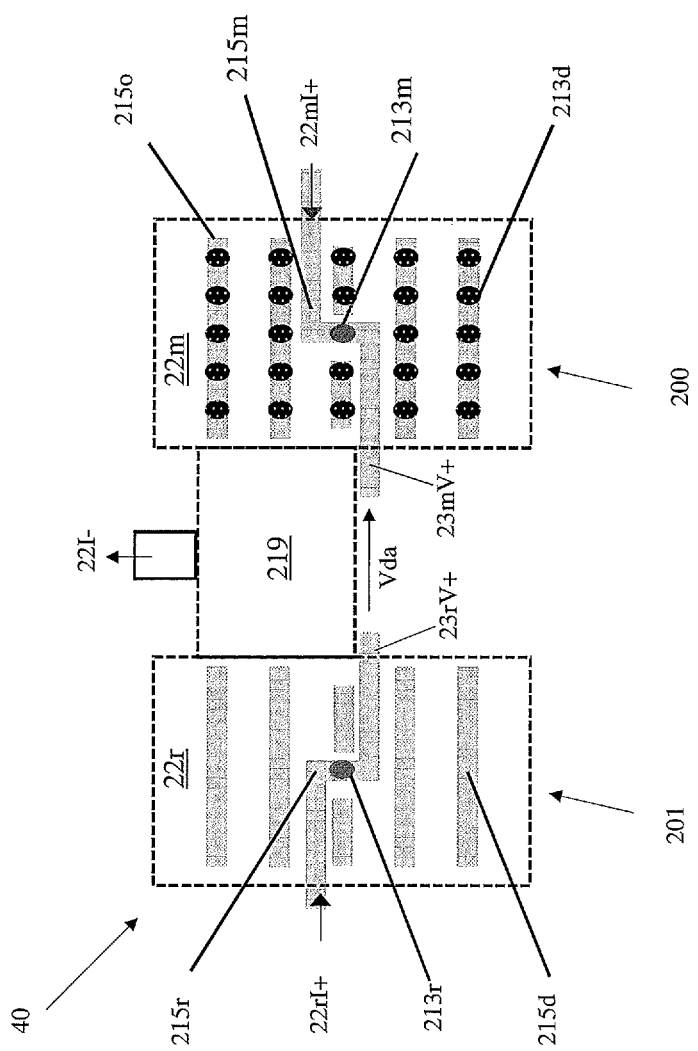
FIG. 5 illustrates a top view an embodiment of a test structure disclosed herein.

In an embodiment shown in FIGS. 4 and 5, a test structure 40 that reduces complexity provided. The items labeled with the same call outs are the same as in FIGS. 2 and 3. However, in FIGS. 4 and 5, the semiconductor test structure upper plate 22m and 22r are electrically connected enabling direct differential measurement by routing the current sourcing path of the Kelvin measurement to the entry point 219 in the plates closest to the measured vias (213r and 213m). This allows a common sink path. Identical currents 22rI+ and 22mI+ are applied to the respective lower metal islands 215r and 215m simultaneously. There is a common drain at 219 shown as 22I−. The differential voltage (Vda) is measured between the lower metal island 215m and lower metal reference island 215r through connections 23mV+ and 23rV+. The differential resistance ΔR is approximately equal to (Vda)/22rI+. In the embodiment shown in FIG. 4, the upper metal plates 22m and 22r can be a single body. In FIG. 5, the test structure 40 shows upper metal plates 22m and 22r in dashed outline for Kelvin test structures 200 and 201 respectively.

In the arrangement shown in FIGS. 4 and 5, effectively the 23rV− and 23mV− points are common, along with merging 22rI− and 22mI− in a common current sink as shown in FIG. 3. The voltage drop is zero or very small between the entry point 219 and the measured via 213m and the entry point 219 and the reference via 213r, when compared to the voltage drop in the vias themselves due to the resistivity difference. The small or zero voltage can be due to the materials and layout dimensions, however, this difference is less than about an order of magnitude (ten times) smaller than the voltage difference due to the resistivity difference in the vias.

By electrically connecting upper metal plate 22m and the upper metal reference plate 22r, the current path of the measured test structure 200 and the reference structure 201 join together into a common sink path.

In embodiments, the functionality of the upper metal plates and lower metal islands are interchangeable. Therefore in an alternative arrangement current polarity and physical arrangement could be inverted achieving the same functionality, by connecting lower metal island and lower reference metal island together with the entry point 219 implemented on the lower metal level thus having a common sink there, and in this case applying the current through the upper metal plate and upper metal reference plate. This arrangement would be considered equivalent to the original arrangement shown in FIGS. 4 and 5.

A differential path is used, where the electrical link 219 between upper metal plate 22m and the upper metal reference plate 22r is attached at a minimum distance point from the measured via 213m to reduce current path length from the vias 213m and 213r to the point where the two current paths join together to drain at 22I−, because these paths still affect the measurements. In embodiments, the optimum performance is achieved when the measured via 213m is closest and in line with the array row/column where the measured via 213m is positioned. The differential output value Vda is a directly proportional to the effect caused by chamfering in the test structure 200 with respect to a reference structure 201 and can be obtained by a single sensing measurement without need for two subsequent sensing steps.

This measurement can be more accurate since in the measurement equipment the best measurement resolution of the differential voltage measurement can be applied using the smallest measurement range above the measured voltage (the resulting differential voltage output of the test structure is directly measured, hence not smaller than the measured voltage of the test equipment). This in a practical case using traditional measurement equipment may result in a ten times better measurement accuracy, because the resistance difference caused by the chamfering is usually about ten times smaller than the via 213m resistance itself.

This test structure of FIGS. 4 and 5 has only five measurement terminals therefore saves space on the wafer surface and allows fast direct monitoring of chamfering and can be implemented in the production line using electrical measurements of Vda. This enables tuning of processes for desired chamfering performance. Critical threshold limits can be set up for warning signal for critical amount of chamfering on a manufactured product using Vda, which is independent of any other effects influencing the via resistance. By using the optimized differential path, the parasitic components in the output value are minimized.

In embodiments, wafer having the first Kelvin testable structure and the second Kelvin testable structure can be configured so that the first testable structure and the second Kelvin testable structure correspond to each other. Thus, the upper metal plate and the upper metal reference plate are identical. The lower metal island and lower metal reference island can be identical. The plurality of lower metal islands and lower metal reference islands can be identical.

The test structures described herein allow detection of unacceptable chamfering through via resistance measurement instead of replicated metal leakage measurement. These test structure enable early warning of "chamfering" even when the process is only marginally approaching the worst case for failure but still hasn't led to failures due to chamfering, because the measured electrical signal is proportional to the depth of chamfering, therefore controls and control limits can be set up to signal values trending towards the critical case even if it is not reached yet. Directly connected differential using entry point 219 saves pad connections, and results in faster measurements.

Via chamfering causes leakages and/or shorts in the lower metal levels. By using the methods and test structures described herein the directly monitoring of shorts or leakages is avoided.

As employed in this specification, the terms "connected" and/or "electrically connected" are not meant to mean that the elements must be directly connected together; intervening elements may or may not be provided between the "connected" or "electrically connected" elements.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

I claim:

1. A semiconductor test device, comprising:
    a first Kelvin testable structure comprising;
        an upper metal plate,
        a plurality of dummy vias and one measurement via under and electrically connected to the upper metal plate, and
        a lower metal island electrically connected to the one measurement via; and
    a second Kelvin testable structure comprising;
        an upper metal reference plate,
        a reference via under and electrically connected to the upper reference metal plate, and
        a lower metal reference island electrically connected to the reference via,
    wherein a position of the one measurement via on the upper metal plate corresponds to a position of the reference via on the upper metal reference plate.

2. The semiconductor test device of claim 1, wherein the first Kelvin testable structure further comprises: a plurality of lower metal islands electrically connected to the plurality of dummy vias.

3. The semiconductor test device of claim 2, wherein the second Kelvin testable structure further comprises a plurality of lower metal reference islands, the plurality of lower metal reference islands corresponding to the plurality of lower metal islands of the first Kelvin testable structure.

4. The semiconductor test device of claim 1, wherein the first Kelvin testable structure and the second Kelvin testable structure are within 1 mm of each other.

5. The semiconductor test device of claim 1, wherein resistance of the measurement via is determined by applying a current to the lower metal island and determining a voltage drop between the upper metal plate and the lower metal island.

6. The semiconductor test device of claim 1, wherein resistance of the reference via is determined by applying a current to the lower metal reference island and determining a voltage drop between the upper metal reference plate and the lower metal reference island.

7. The semiconductor test device of claim 6 wherein the resistance of the measurement via is compared with the resistance of the reference via.

8. The semiconductor test device of claim 1, wherein the upper metal plate and the upper reference metal plate are electrically connected.

9. The semiconductor test device of claim 8, wherein differential resistance between the measurement via and reference via is determined by simultaneously applying a current to the lower metal island and the current to the lower metal reference island and determining a voltage drop between the lower metal island and the lower metal reference island.

10. The semiconductor test device of claim 1, wherein the upper metal reference plate and lower metal reference island correspond to the upper metal plate and the lower metal island.

11. A semiconductor test device, comprising:
    a first Kelvin testable structure comprising;
        an upper metal plate,
        a plurality of dummy vias and one measurement via under and electrically connected to the upper metal plate, and
        a lower metal island electrically connected to the one measurement via; and
    a second Kelvin testable structure comprising;
        an upper metal reference plate,
        a reference via under and electrically connected to the upper reference metal plate, and
        a lower metal reference island electrically connected to the reference via, wherein the upper metal plate and the upper reference metal plate are electrically connected.

12. The semiconductor test device of claim 11, wherein the first Kelvin testable structure further comprises:
    a plurality of lower metal islands electrically connected to the plurality of dummy vias.

13. The semiconductor test device of claim 12, wherein the second Kelvin testable structure further comprises:
    a plurality of lower metal reference islands corresponding to the plurality of lower metal islands of the first Kelvin testable structure.

14. The semiconductor test device of claim 11, wherein the first Kelvin testable structure and the second Kelvin testable structure are within 1 mm of each other.

15. The semiconductor test device of claim 11, wherein differential resistance between the measurement via and reference via is determined by:
    simultaneously applying a current to the lower metal island and the current to the lower metal reference island, and
    determining a voltage drop between the lower metal island and the lower metal reference island.

* * * * *